United States Patent
Rowe et al.

(10) Patent No.: US 7,145,378 B2
(45) Date of Patent: Dec. 5, 2006

(54) CONFIGURABLE SWITCH WITH SELECTABLE LEVEL SHIFTING

(75) Inventors: Brent Rowe, Cumberland, ME (US); Lee Sledjeski, South Portland, ME (US)

(73) Assignee: Fairchild Semiconductor Corporation, Portland, ME (US)

( * ) Notice: Subject to any disclaimer, the term of this patent is extended or adjusted under 35 U.S.C. 154(b) by 808 days.

(21) Appl. No.: 09/906,412

(22) Filed: Jul. 16, 2001

(65) Prior Publication Data
US 2003/0012186 A1    Jan. 16, 2003

(51) Int. Cl.
*H03K 17/687* (2006.01)

(52) U.S. Cl. ........................... 327/427; 327/434

(58) Field of Classification Search ........... 327/403, 327/404, 427, 434
See application file for complete search history.

(56) References Cited

U.S. PATENT DOCUMENTS

| | | | | |
|---|---|---|---|---|
| 5,289,062 A | * | 2/1994 | Wyland | 327/389 |
| 5,751,168 A | * | 5/1998 | Speed et al. | 326/83 |
| 5,880,620 A | * | 3/1999 | Gitlin et al. | 327/534 |
| 5,963,080 A | | 10/1999 | Miske et al. | 327/534 |
| 6,137,340 A | | 10/2000 | Goodell et al. | 327/407 |
| 6,215,342 B1 | | 4/2001 | Morrill | 327/143 |
| 6,233,643 B1 | | 5/2001 | Andrews et al. | 710/131 |
| 6,236,259 B1 | | 5/2001 | Goodell et al. | 327/534 |
| 6,396,325 B1 | | 5/2002 | Goodell | 327/308 |
| 6,400,618 B1 | | 6/2002 | Nakamura et al. | 365/200 |
| 6,433,613 B1 | * | 8/2002 | Goodell et al. | 327/427 |
| 6,442,097 B1 | * | 8/2002 | Song | 365/230.03 |

OTHER PUBLICATIONS

International Search Report, International Application No. PCT/US 02/20930 (all pages).

* cited by examiner

*Primary Examiner*—Quan Tra
(74) *Attorney, Agent, or Firm*—Cesari and McKenna, LLP; Edwin H. Paul, Esq.

(57) ABSTRACT

A configurable bus switch is described where the bus switches are grouped into combinations as determined by logic inputs. NMOS transistors are the bus switches of choice, and programmable logic inputs select and enable groupings of these switches. Switch enable signals drive the NMOS transistor gates and turn on or off the groups according to the programmable logic inputs. Level shifting and undervoltage protection circuitry is described in preferred embodiments.

13 Claims, 6 Drawing Sheets

TRUTH TABLES ($X = V_{CC}$ OR GND)
(SEE FUNCTIONAL DESCRIPTION)

| SELECT PIN | |
|---|---|
| $S_2$ | MODE |
| L | STD. NMOS SWITCH |
| H | LEVEL SHIFTING DIODE ENABLED |

| CONFIGURATION 1 | | $S_0 = S_1 = L$ | | | 20-BIT CONFIGURATION |
|---|---|---|---|---|---|
| INPUTS | | | | | INPUTS/OUTPUTS |
| $\overline{OE_1}$ | $\overline{OE_2}$ | $\overline{OE_3}$ | $\overline{OE_4}$ | $\overline{OE_5}$ | |
| L | X | X | X | X | $1A_{1\text{-}10} = 1B_{1\text{-}10}, 2A_{1\text{-}10} = 2B_{1\text{-}10}$ |
| H | X | X | X | X | Z |

| CONFIGURATION 2 | | $S_0 = L, S_1 = H$ | | | 10-BIT CONFIGURATION | |
|---|---|---|---|---|---|---|
| INPUTS | | | | | INPUTS/OUTPUTS | |
| $\overline{OE_1}$ | $\overline{OE_2}$ | $\overline{OE_3}$ | $\overline{OE_4}$ | $\overline{OE_5}$ | $1A_{1\text{-}10} = 1B_{1\text{-}10}$ | $2A_{1\text{-}10} = 2B_{1\text{-}10}$ |
| L | X | X | L | X | $1A_X = 1B_X$ | $2A_X = 2B_X$ |
| L | X | X | H | X | $1A_X = 1B_X$ | Z |
| H | X | X | L | X | Z | $2A_X = 2B_X$ |
| H | X | X | H | X | Z | Z |

| CONFIGURATION 3 | | $S_0 = H, S_1 = L$ | | | 5-BIT CONFIGURATION | | | |
|---|---|---|---|---|---|---|---|---|
| INPUTS | | | | | INPUTS/OUTPUTS | | | |
| $\overline{OE_1}$ | $\overline{OE_2}$ | $\overline{OE_3}$ | $\overline{OE_4}$ | $\overline{OE_5}$ | $1A_{1\text{-}5}, 1B_{1\text{-}5}$ | $1A_{6\text{-}10}, 1B_{6\text{-}10}$ | $2A_{1\text{-}5}, 2B_{1\text{-}5}$ | $2A_{6\text{-}10}, 2B_{6\text{-}10}$ |
| L | L | L | L | X | $1A_X = 1B_X$ | $1A_Y = 1B_Y$ | $2A_X = 2B_X$ | $2A_Y = 2B_Y$ |
| L | L | L | H | X | $1A_X = 1B_X$ | $1A_Y = 1B_Y$ | $2A_X = 2B_X$ | Z |
| L | L | H | L | X | $1A_X = 1B_X$ | $1A_Y = 1B_Y$ | Z | $2A_Y = 2B_Y$ |
| L | L | H | H | X | $1A_X = 1B_X$ | $1A_Y = 1B_Y$ | Z | Z |
| L | H | L | L | X | $1A_X = 1B_X$ | Z | $2A_X = 2B_X$ | $2A_Y = 2B_Y$ |
| L | H | L | H | X | $1A_X = 1B_X$ | Z | $2A_X = 2B_X$ | Z |
| L | H | H | L | X | $1A_X = 1B_X$ | Z | Z | $2A_Y = 2B_Y$ |
| L | H | H | H | X | $1A_X = 1B_X$ | Z | Z | Z |
| H | L | L | L | X | Z | $1A_Y = 1B_Y$ | $2A_X = 2B_X$ | $2A_Y = 2B_Y$ |
| H | L | L | H | X | Z | $1A_Y = 1B_Y$ | $2A_X = 2B_X$ | Z |
| H | L | H | L | X | Z | $1A_Y = 1B_Y$ | Z | $2A_Y = 2B_Y$ |
| H | L | H | H | X | Z | $1A_Y = 1B_Y$ | Z | Z |
| H | H | L | L | X | Z | Z | $2A_X = 2B_X$ | $2A_Y = 2B_Y$ |
| H | H | L | H | X | Z | Z | $2A_X = 2B_X$ | Z |
| H | H | H | L | X | Z | Z | Z | $2A_Y = 2B_Y$ |
| H | H | H | H | X | Z | Z | Z | Z |

FIG. 3A

TRUTH TABLES (CONTINUED)

CONFIGURATION 4 $S_0 = S_1 = H$ — 4-BIT CONFIGURATION (40)

| INPUTS | | | | | INPUTS/OUTPUTS (48) | | | | |
|---|---|---|---|---|---|---|---|---|---|
| $\overline{OE}_1$ | $\overline{OE}_2$ | $\overline{OE}_3$ | $\overline{OE}_4$ | $\overline{OE}_5$ | $1A_{1-4}, 1B_{1-4}$ | $1A_{5-8}, 1B_{5-8}$ | $2A_{3-6}, 2B_{3-6}$ | $2A_{7-10}, 2B_{7-10}$ | $1A_{9-10}, 1B_{9-10}, 2A_{1-2}, 2B_{1-7}$ |
| L | L | L | L | L | $1A_X = 1B_X$ | $1A_Y = 1B_Y$ | $2A_X = 2B_X$ | $2A_Y = 2B_Y$ | $1A_Z = 1B_Z$ $2A_Z = 2B_Z$ |
| L | L | L | L | H | $1A_X = 1B_X$ | $1A_Y = 1B_Y$ | $2A_X = 2B_X$ | $2A_Y = 2B_Y$ | Z |
| L | L | L | H | L | $1A_X = 1B_X$ | $1A_Y = 1B_Y$ | $2A_X = 2B_X$ | Z | $1A_Z = 1B_Z$ $2A_Z = 2B_Z$ |
| L | L | L | H | H | $1A_X = 1B_X$ | $1A_Y = 1B_Y$ | $2A_X = 2B_X$ | Z | Z |
| L | L | H | L | L | $1A_X = 1B_X$ | $1A_Y = 1B_Y$ | Z | $2A_Y = 2B_Y$ | $1A_Z = 1B_Z$ $2A_Z = 2B_Z$ |
| L | L | H | L | H | $1A_X = 1B_X$ | $1A_Y = 1B_Y$ | Z | $2A_Y = 2B_Y$ | Z |
| L | L | H | H | L | $1A_X = 1B_X$ | $1A_Y = 1B_Y$ | Z | Z | $1A_Z = 1B_Z$ $2A_Z = 2B_Z$ |
| L | L | H | H | H | $1A_X = 1B_X$ | $1A_Y = 1B_Y$ | Z | Z | Z |
| L | H | L | L | L | $1A_X = 1B_X$ | Z | $2A_X = 2B_X$ | $2A_Y = 2B_Y$ | $1A_Z = 1B_Z$ $2A_Z = 2B_Z$ |
| L | H | L | L | H | $1A_X = 1B_X$ | Z | $2A_X = 2B_X$ | $2A_Y = 2B_Y$ | Z |
| L | H | L | H | L | $1A_X = 1B_X$ | Z | $2A_X = 2B_X$ | Z | $1A_Z = 1B_Z$ $2A_Z = 2B_Z$ |
| L | H | L | H | H | $1A_X = 1B_X$ | Z | $2A_X = 2B_X$ | Z | Z |
| L | H | H | L | L | $1A_X = 1B_X$ | Z | Z | $2A_Y = 2B_Y$ | $1A_Z = 1B_Z$ $2A_Z = 2B_Z$ |
| L | H | H | L | H | $1A_X = 1B_X$ | Z | Z | $2A_Y = 2B_Y$ | Z |
| L | H | H | H | L | $1A_X = 1B_X$ | Z | Z | Z | $1A_Z = 1B_Z$ $2A_Z = 2B_Z$ |
| L | H | H | H | H | $1A_X = 1B_X$ | Z | Z | Z | Z |
| H | L | L | L | L | Z | $1A_Y = 1B_Y$ | $2A_X = 2B_X$ | $2A_Y = 2B_Y$ | $1A_Z = 1B_Z$ $2A_Z = 2B_Z$ |
| H | L | L | L | H | Z | $1A_Y = 1B_Y$ | $2A_X = 2B_X$ | $2A_Y = 2B_Y$ | Z |
| H | L | L | H | L | Z | $1A_Y = 1B_Y$ | $2A_X = 2B_X$ | Z | $1A_Z = 1B_Z$ $2A_Z = 2B_Z$ |
| H | L | L | H | H | Z | $1A_Y = 1B_Y$ | $2A_X = 2B_X$ | Z | Z |

FIG. 3B

| TRUTH TABLES (CONTINUED) | | | | | | | | | |
|---|---|---|---|---|---|---|---|---|---|
| CONFIGURATION 4 $S_0 = S_1 = H$ | | | | | 4-BIT CONFIGURATION | | | | |
| INPUTS | | | | | INPUTS/OUTPUTS | | | | |
| $\overline{OE}_1$ | $\overline{OE}_2$ | $\overline{OE}_3$ | $\overline{OE}_4$ | $\overline{OE}_5$ | $1A_{1-4}$, $1B_{1-4}$ | $1A_{5-8}$, $1B_{5-8}$ | $2A_{3-4}$, $2B_{3-4}$ | $2A_{7-10}$, $2B_{7-10}$ | $1A_{9-10}, 1B_{9-10}$ $2A_{1-2}, 2B_{1-7}$ |
| H | L | H | L | L | Z | $1A_Y = 1B_Y$ | Z | $2A_Y = 2B_Y$ | $1A_Z = 1B_Z$ $2A_Z = 2B_Z$ |
| H | L | H | L | H | Z | $1A_Y = 1B_Y$ | Z | $2A_Y = 2B_Y$ | Z |
| H | L | H | H | L | Z | $1A_Y = 1B_Y$ | Z | Z | $1A_Z = 1B_Z$ $2A_Z = 2B_Z$ |
| H | L | H | H | H | Z | $1A_Y = 1B_Y$ | Z | Z | Z |
| H | H | L | L | L | Z | Z | $2A_X = 2B_X$ | $2A_Y = 2B_Y$ | $1A_Z = 1B_Z$ $2A_Z = 2B_Z$ |
| H | H | L | L | H | Z | Z | $2A_X = 2B_X$ | $2A_Y = 2B_Y$ | Z |
| H | H | L | H | L | Z | Z | $2A_X = 2B_X$ | Z | $1A_Z = 1B_Z$ $2A_Z = 2B_Z$ |
| H | H | L | H | H | Z | Z | $2A_X = 2B_X$ | Z | Z |
| H | H | H | L | L | Z | Z | Z | $2A_Y = 2B_Y$ | $1A_Z = 1B_Z$ $2A_Z = 2B_Z$ |
| H | H | H | L | H | Z | Z | Z | $2A_Y = 2B_Y$ | Z |
| H | H | H | H | L | Z | Z | Z | Z | $1A_Z = 1B_Z$ $2A_Z = 2B_Z$ |
| H | H | H | H | H | Z | Z | Z | Z | Z |

CONFIGURABLE SWITCH WITH SELECTABLE LEVEL SHIFTING

BACKGROUND OF THE INVENTION

1. Field of the Invention

The present invention relates to electronic bus switches used for transferring electrical signals from one location to another, and more particularly to the configurations or groupings of such bus switches.

2. Background Information

Bus switches have been used to isolate circuits from each other for many years. These switches provide a low on resistance that allows signals to transfer between sending and receiving circuitry and a high off impedance that isolates that circuitry from each other. The development of transistor technology, especially MOS transistors, has resulted in low-cost, very reliable semiconductor switches that are typically implemented as single pole single throw switches.

Isolating bus signals and thereby preserving bus signal integrity is a requirement of a modern system. When buses are shared, the signals traveling on the bus must not affect and must not be affected by circuitry and other signals not on the bus—bus isolation is required for proper system operation. This bus isolation is especially important when "hot swapping" is a feature of the system. "Hot swapping" is the ability to remove and insert circuit boards without removing power and without interrupting the system operations or damaging the system. Effective bus isolation is an ingredient meant to accommodate such "hot swapping." Isolating circuits from one another is important across edge, socket or other types of connectors where the circuitry is at risk when connections or contacts are being made or broken. Plugging in the wrong circuit, miss-alignments, power spikes, and physically damaging the connectors and/or the contacts illustrate some of the problems when physically making and breaking connections.

In the past, mechanical relays and bipolar transistors switches were used, but for most applications, including transferring compatible analog signals, and virtually all digital computer circuitry applications, MOS field effect transistors (usually NMOS) are the bus switch component of choice. NMOS transistors provide low on resistances, can withstand the voltage/current stresses typically associated with digital electronics, are compatible with both high (5V) and low (3.3V) TTL logic signals, exhibit no "bounce" as found in some mechanical relays, include no "offset" drops (pn junction), exhibit minimal propagation delays, are reliable and can be densely packaged in the newest high pin out packages.

NMOS transistor switches are found in a wide variety of products, including desktop and notebook computers, hand held personal data assistants, servers, video/sound cards, mobile phones, video games, and communication electronics. These switches may also be used in multiplexers, switch based gates, and analog switches. In any event, bus switches may be found wherever electronics exist.

However, with the many applications for bus switches, there is a wide variety of organizations, bit widths, pin outs, and package sizes available from many manufacturers. Moreover, circuit design revisions often dictate different configurations and/or organizations of the bus switches that may require different packages and/or control logic. A sampling of applications includes bus bit widths of four, five, eight, ten, sixteen, twenty, forty and eighty bits, available in many different packages. However, any bit widths can be accommodated limited only by the current packaging or interconnecting technology and the different configurabilities required by the system designer.

At the present time, manufacturers using and specifying bus switches must stock many different device types, and they must retain older types for rework and repair. The present invention is directed to resolving these limitations.

SUMMARY OF THE INVENTION

The limitations of the prior art are addressed in the present invention by a configurable bus switch. A transfer switch, preferably an NMOS transistor, is arranged electrically in series in each bus line connecting a first to a second circuit. Each of these bus switches is controlled on or off in response to a switch enable logic signal.

There is a logic control that receives configuration logic signals, and, in response to these configuration logic signals, forms logical groups of the switch enable signals so that corresponding transfer switches are switched on and off in concert. In a preferred embodiment, if a group of four switches has been configured, the switch enables for these four switches to all act in unison turning on or off the four switches simultaneously.

In a preferred embodiment, the configuration groupings of the switches are in powers of two (2, 4, 8, 16, etc.), but in other embodiments the configuration groupings may by tens (10, 20, etc.), but any set of groupings, even unsymmetrical groupings where the groupings of switches are not related directly to each other, for example, (4, 7, 11, 12) can be used. The present invention provides the ability to configure any bit width and is practically limited only by the packaging and interconnect technology and the requirements of the particular system.

In yet other advantageous applications, the present invention may be coupled with a transfer switch that provides for selectable reference voltage level shifting. Another advantage of the present invention is the ability to replace several bus switch packages with one configurable bus switch thereby saving board layout space and allowing the manufacturer to stock only one part rather than several.

These and other advantages of the present invention will become apparent upon review of the detailed description, the accompanying drawings, and the claims.

BRIEF DESCRIPTION OF THE DRAWINGS

The invention description below refers to the accompanying drawings, of which:

FIGS. 3A and 3B are truth tables;

DETAILED DESCRIPTION OF AN ILLUSTRATIVE EMBODIMENT

Figure 1:
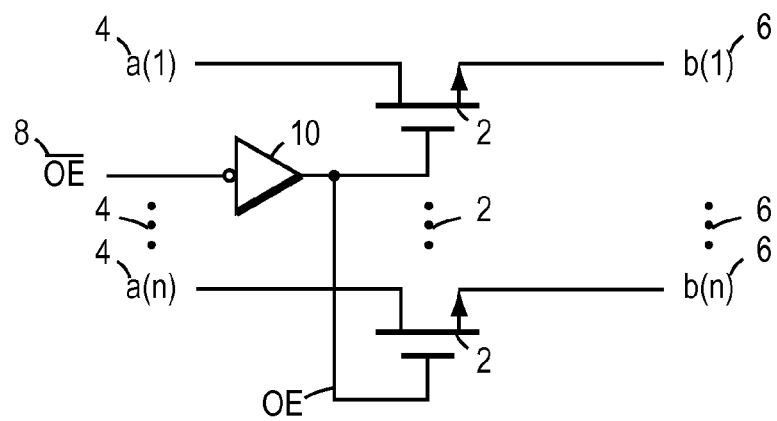
FIG. 1 is schematic of a prior art bus switch.

FIG. 1 shows a basic NMOS transistors bus switch 2. The "a" signals 4 are to be connected to the "b" signals 6 when the NMOS transistors are "on." An "on" NMOS transistor presents a low impedance between the "a's" and the "b's." The "a's" are connected to the drains and the "b's" to the source of the NMOS transistos, and the gates are connected via an inverter 10 to a single low true enabling control OE– 8. Herein a minus sign following a signal takes the place of the bar over the label as is more typical in logic equations. When a low OE− signal is input to the inverter 10 the inverter output drives the gates of the NMOS transistors high. This high gate allows a conduction channel to form between the drain and the source thereby making an electrical connection between the "a's" and "b's." When the low true OE− enable input is high, the inverter output is low and a low gate voltage depletes the conduction channel thereby breaking the electrical connection and isolating the "a's" from the "b's." A single enable is often used since in most digital bus applications the entire bus is switched in concert.

Figure 2:
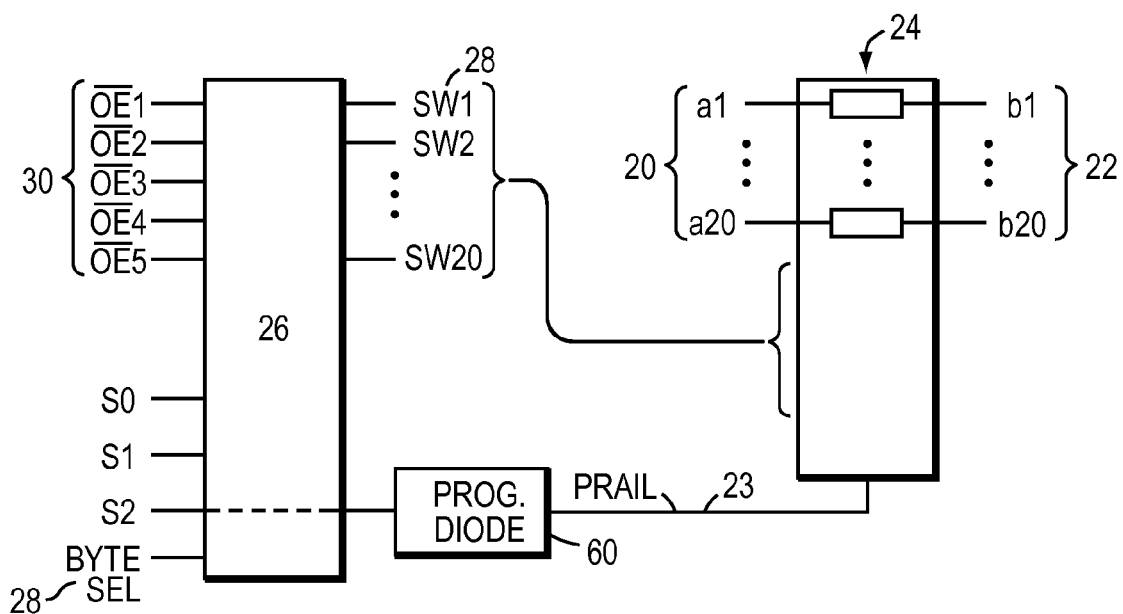
FIG. 2 is a schematic block diagram of an embodiment of the present invention.

FIG. 2 is a block diagram of a preferred embodiment of the present invention having twenty "a" inputs 20 and twenty "b" outputs 22 joined by twenty bus switches 24. In this example, as compared to the prior art FIG. 1, there are twenty bus enable signals 28 one for each of the bus switches 24. A logic control circuit 26 decodes the configuration of the twenty bus enable signals from the five enable (OE) inputs 30 and two select inputs S0 and S1. Logical combinations of these input signals determine the states of the switch enables 28, and therefrom the states of the transfer switches.

"A separate diode enable input S2, drives a circuit 60 that mimics a programmable diode with an output prail 23 that is connected to all the switches 8. When S2 is true it enables a voltage level shifting function for the bus switches. Most typically the level shifting is between +5V and +3.3V as discussed later."

In other preferred embodiments, the bus switches 24 may be grouped into virtually any combination and the particular groups may be enabled in virtually any combination consistent with the number of binary logic input signals (OE's and S's) available.

Still referring to FIG. 2, the two select or configuration inputs, S0 and S1, are input to the control logic 26. These two signals select one of four different bus configurations: one group of twenty, two groups of ten, four groups of five, and five groups of four. Because of the popularity of 8 and 16 bit widths, a byte 28 select signal is input to the control logic that causes the one group of twenty, when selected, to be one group of sixteen, and the two groups of ten to be two groups of eight. With respect to the five groups of four, enables (OE's) may be tied together to provide two groups of eight. In this embodiment, the five enable signals (OE's) determine which switch groups are on and which are off as shown in the truth tables of FIGS. 3A and B.

Herein configuration defines the selecting of groups of bus signals switched concurrently.

FIGS. 3A and B show various configurations of a preferred embodiment of the invention. With respect to FIG. 3A, in the first table 30, S2 high (H) indicates that the level shifting diode is enabled (see FIG. 2) outputting "prail," a lowered voltage, to the transfer switches. This selected level shifting is independent of the other signals.

Table 32 of FIG. 3A shows the combination of S0 and S1 (both low) that selects a single twenty bit bus, or if byte sel is true (not shown in table 3A) a single 16 bit bus. In this configuration the low true OE− signal 36 determines the states of the transfer gates themselves. As shown, when OE1− is low, all the twenty enables are true and the twenty "a" inputs are connected to the twenty "b" outputs. When OE1− is high the inputs are isolated (shown by the "z") from the outputs. Table 34, two groups of ten; table 38, four groups of five, and the table 40 of FIG. 3B, five groups of four, show the groups of switches that are enabled for the other three configurations.

With respect to FIGS. 2, 3A and B, the logic controller 26 accepts the OE's, S's, and byte sel inputs and produces the switch enable signals 28 that drive the transfer NMOS switches 24 in accordance with the combinations of the FIGS. 3A and 3B tables.

As discussed above, from table 32, looking at the S0 and S1 signals, when both are low, configuration 1—twenty bit bus, is selected, and when OE1− is low all the twenty switches are enabled or on, thereby connecting the inputs to the outputs. The logic equation for this condition can be written (S0−)(S1−)(OE1−)=all twenty SW's are on. In table 32 this condition is shown at row 42. When OE− is high or false all SW's are off. With respect to table 34, when S0 is low and S1 high configuration 2 is selected—two ten bit buses. The logic equation for table entry 44 is (OE1−)(OE4−)(S0−)(S1)=the ten switches in each group are all on. If only OE4 goes high only the first ten switches are on and the second ten are off 46. Notice that the first ten switches are on regardless of the state of OE4− they only depend on OE1. In a similar fashion as known in the art, the logic equations for the output switch groups can be determined from each table. In this way the logic equations for each switch from all the tables combined can be determined. For example, in table 40, there are five groups with four switches in each group. Notice for the grouping 48 of the first four switches. These switches are on for the first sixteen rows of table 40. These same first four switches are included in the first group 50 of five switches in the first eight rows of table 38, and in the first group 52 of ten switches in table 34 and in the single groups of twenty in table 32. Combining these switch enable states over the four different groups, each of the first four bus switch enable signals, SW1–SW4, will be on as determined by following logic equations derived from the tables:

$SW1\text{--}SW4$ on=$(S0-)(S1-)(OE-)$ from table 32, $SW1\text{--}SW4$ on=$(S0-)(S1)(OE1-)$ from table 34—note that $OE4-$ does not matter $SW1\text{--}SW4$ on=$(S0)(S1-)(OE1-)$ from table 38—note that $OE2-$, $OE3-$, and $OE4-$ do not matter, $SW1\text{--}SW4$ on=$(S0)(S1)(OE1-)$ from table 40 note that none of the other $OE$'s matter.

These logic equations are OR'ed together, since the switches are "on" in each case, reducing this embodiment to the first four switch enable signals being true whenever OE1−is low, or SW1–SW4 on=OE1−. This is borne out by inspection of the tables.

Continuing the illustrative example for, say, switch enable SW10:

$SW10$ on=$(S0-)(S1-)(OE1-)$ from table 32, $SW10$ on=$(S0-)(S1)(OE1-)$ from table 34—note that $OE4-$ does not matter, $SW10$ on=$(S0)(S1-)(OE2-)$ from table 38—note that $OE1-$, $OE3-$, and $OE4-$ do not matter, $SW10$ on=$(S0)(S1)(OE5-)$ from table 40 note that none of the other $OE$'s matter.

These logic equations are also OR'ed together. As known in the art, combining these above equations for SW10 results in this equation:

$SW10$ on=$(OE1-)(S0-)+(OE2-)(S0)(S1-)+(OE5-)(S0)(S1)$

In a similar manner logic equations can be developed for any one group of switches or for any one switch for any possible logical combination within the combination range of the inputs. When the logic equations are known they may be implemented in a number of different manners. For example, with combinational logic circuits such as AND, OR, NOT, NAND, etc. that are well known. Other examples include using a table look-up where the binary inputs (OE's, S's) are addresses into a table (memory) and the table contents are the switch enable outputs (SW's). In addition the combinations may be calculated and stored in a memory and output using a microprocessor, or the combinations could be delivered to the bus switches from a processor via some communications link. These and other ways to generate the switch enables are possible but include other considerations and designs that must be implemented but that are well known in the art.

Figure 4:
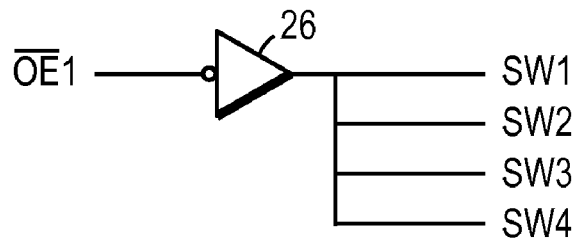
FIGS. 4 and 5 are logic circuits schematics.
Figure 5:
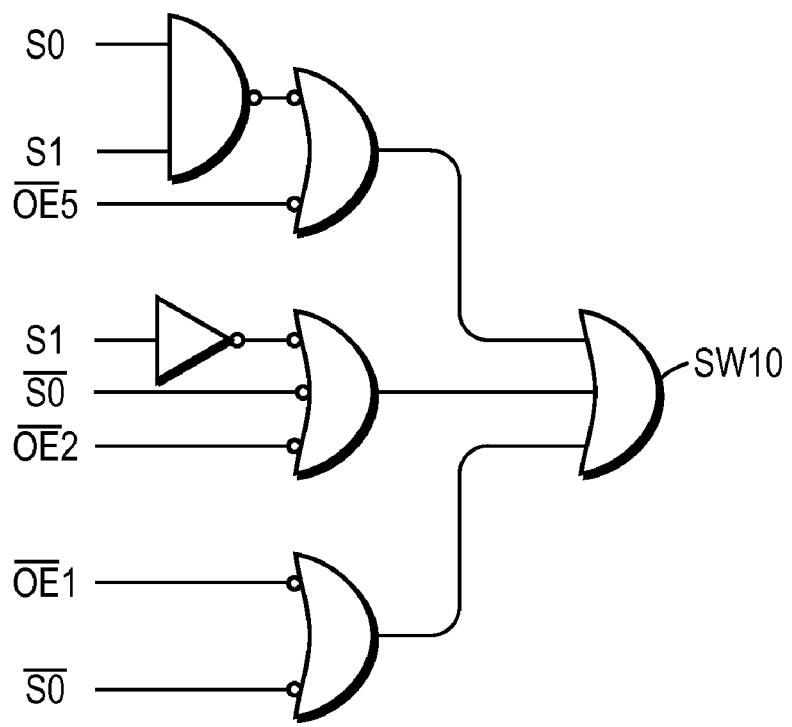

FIG. 4 shows the logic circuit design of the driving SW1–SW4 from the tables as discussed above, all being simply an inverted signal OE1–. In this example the SW's are high true and provide a high signal to the NMOS transfer switches 24 thereby turning these switches on. FIG. 5 shows the logic for SW10. Of course more complex logic circuitry would be defined for other combinations that may be chosen.

In the tables when all the OE's are high the logic outputs SW's are low turning off all the NMOS transfer switches. In other embodiments a separate "enable/disable all" logic input signal could be used.

Figure 6:
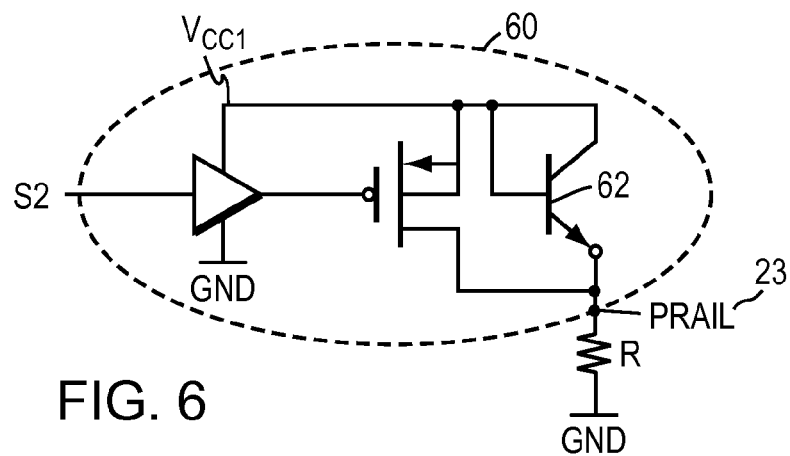
FIG. 6 is a programmable diode schematic.

FIG. 6 shows the programmable diode from FIG. 2. When S2 is high the gate of PMOS 60 is high turning off this PMOS transistor. In this case the base/emitter of the bipolar silicon NPN transistor 62 is forward biased and prail is lower that Vcc1 by the 0.7V pn junction drop. The NPN still acts as a transistor and as such supplies most of the current to R via the collector/emitter while maintaining the single diode voltage drop. When S2 is low, the gate of the PMOS 60 is low turning "on" the PMOS which effectively shorts the base emitter junction of the transistor 62. In this instance the Vcc1 feeds through the low PMOS "on" resistance to the prail. The prail output is driven to the Vcc1 level (less the drop across PMOS 60) and so no level shifting is enabled.

Figure 7:
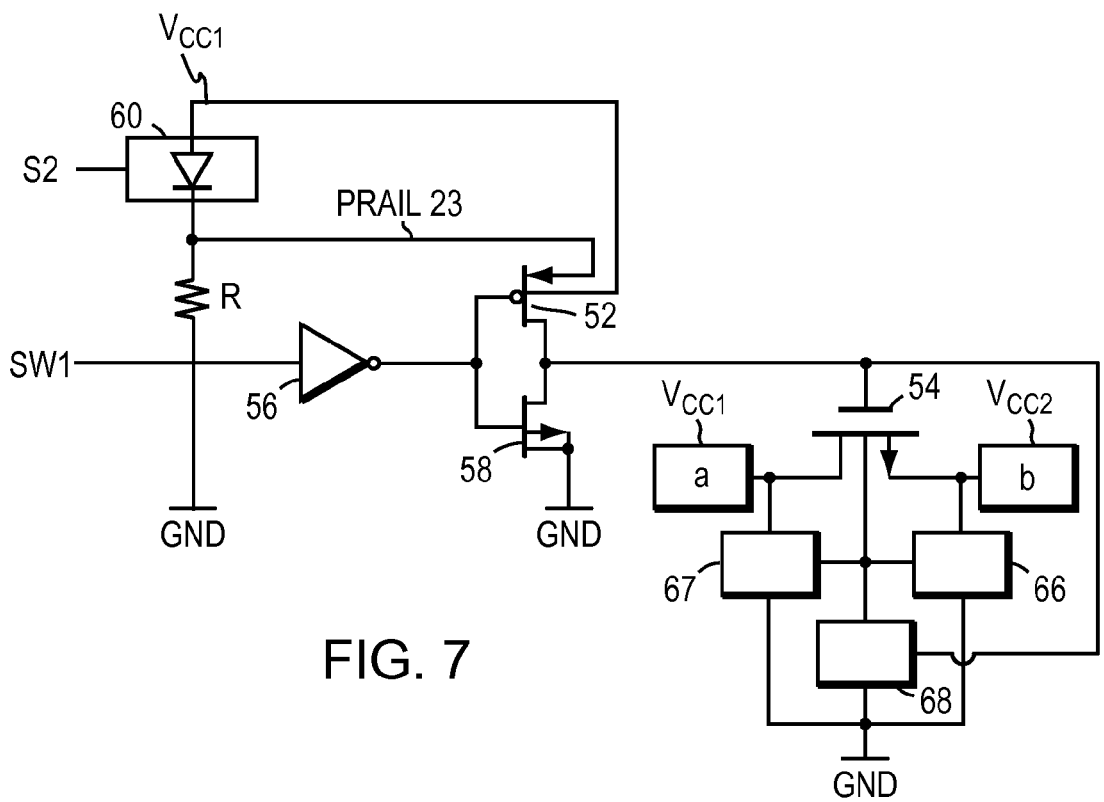
FIG. 7 is a NMOS transfer switch schematic.

FIG. 7 is an example of one NMOS transfer switch 54 including selectable level shifting provided by the programmable diode 60 and its control input S2. The output of the programmable diode 60, prail, is at least one silicon diode drop (0.7V) below Vcc1 when the diode is conducting. The prail is connected to the source of a PMOS 52. When the switch enable SW1 is high the inverter 56 output is low turning "on" the PMOS 52 and the NMOS 58 "off." In this case the prail less the PMOS transistor 52 drop is presented to the gate of the transfer switch 54. The transfer switch is "on" connecting circuit "a" and "b." With gate of the NMOS 54 connected to the prail via 52 the signal out to the b circuits is level shifted down from Vcc1 to about 3.3V to be compatible with the 3.3V (Vcc2) powering the "b" circuitry. When S2 is low the diode 60 is shorted out and the prail is driven close to Vcc1. The SW1 enable signal is high, PMOS 52 is "on," and the gate of NMOS 54 is nearer to Vcc1. In this condition the level shifting is disabled. In other designs, not shown, parallel transistors can be used to drive the prail closer to Vcc1.

FIG. 7 also shows circuitry 68 connected to the gate of the NMOS 52, and circuitry 67 and 66 connected to the drain and the source, respectively. This circuitry, well known in the field, protects the NMOS transfer switch from undervoltages by limiting malfunction causing differential voltages that might exist among and between the drain, source, gate and the body connections of NMOS transistors. Typically the malfunction is an NMOS that erroneously is turned on by an undervoltage. U.S. Pat. Nos. 5,963,080 and 6,236,259, both owned by the assignee of this application, detail such circuit designs. These two patents are hereby incorporated herein by reference.

The present inventive configurable bus switch provides the system designer with a flexible approach not previously available. The configuration, the enabling of the switches, and the level shifting feature are determined by logic inputs, and so they are programmable. In some embodiments the "S" and "OE" logic inputs could be soldered making hard connections. However, more often the logic inputs would be manually programmable via mini-switches, or they may be driven by a processor via a stored program or by a program communicated to the processor. In this manner, the groupings and enablements may be dynamically programmable to suit a particular need or to implement a change as determined by a distant party.

What is claimed is:

1. A bus switch for electrically making and breaking a plurality connections between a first and a second circuit comprising:

a plurality of transfer transistor switches, each arranged as one of the plurality of connections, a plurality of programmable logic inputs, wherein the logical combinations of the states of the programmable logic inputs define different configurations of the transfer transistor switches in a make or break state, and wherein the different configurations run from no switches in a make state to one or more switches, in any combination, in a make state, logic circuitry that accepts the plurality of logic inputs and provides a corresponding plurality of enable outputs connected to the transfer transistor switches, wherein the enable outputs make and break the transfer transistor switches in any of the different configurations in accordance with the programmable logic inputs, selectable level shifting circuitry that provides a reference voltage to control terminals on the transfer transistor switches that is lower than that of the first circuit, a level select input that enables the level shifting circuitry when true and disables it when false, so that when false there is no level shifting, and wherein the logic inputs comprise a first set of programmable logic inputs that selects a configuration with a number of groupings of transfer transistor switches and a second set of programmable inputs that determine the make or break state of drive each transfer transistor switch within each grouping.

2. The bus switch as defined in claim 1 wherein each transfer transistor switch comprises an NMOS transistor with each drain connected to the first circuit and each source connected to the second circuit.

3. The bus switch as defined in claim 1 wherein the logic circuitry comprises:

circuitry that protects the configurable bus switch from undervoltages that may cause malfunctions.

4. The bus switch as defined in claim 1 wherein the configurations are arranged in powers of two.

5. The bus switches as defined in claim 1 wherein the number of bus connections is twenty and the logic inputs define configurations of bus switches in groups of four, or five, or eight or ten or sixteen or twenty.

6. The bus switch as defined in claim 1 wherein the logic circuitry comprises:

a digital processor, related memory and input/output circuitry arrange and constructed to decode the logic inputs and determine and output therefrom corresponding enables to make or break the transistors switches.

7. A bus switch for electrically making and breaking a plurality connections between a first and a second circuit comprising:
  a plurality of NMOS transfer transistor switches, each arranged to provide one of the connections, with the drains connected to the first circuit and the sources connected to the second circuit,
  a first set of prograniniable logic inputs wherein the logical combinations of the states of the logic inputs select a number of groupings of the transfer transistor switches and a second set of programmable inputs that determine the make or break state of the transfer transistor switches, and wherein the logic inputs are referenced to a first power rail,
  logic circuitry that accepts the plurality of inputs and provides a corresponding plurality of enable outputs connected to the gates of the NMOS transistor switches and wherein the enable outputs make and break the transfer transistor switches in any combination in accordance with the logical states of the logic inputs,
  selectable level shifting circuitry that provides a reference voltage to control terminals on the transfer transistor switches that is lower than that of the first circuit,
  a select input that enables the level shifting circuitry when true and disables it false, so that when false there is no level shifting, and
  circuitry that protects the configurable bus switch from undervoltages that may cause malfunctions.

8. A bus switch comprising:
  switching means for electrically making and breaking a plurality connections between a first and a second circuit,
  means for determining logical combinations of different configurations of the switching means, and
  means for operating the switching means in any configuration from no connections making to one or more connections making in accordance with the logical combinations,
  selectable level shifting circuitry that provides a reference voltage to control terminals on the switching means that is lower than that of the first circuit,
  a select input that enables the level shifting circuitry when true and disables it false, so that when false there is no level shifting, and
  means for protecting the bus switch from undervoltages that may cause malfunctions of the bus switch.

9. The bus switch as defined in claim 8 wherein the means for determining the logical combinations comprises means for processing and decoding the logic inputs, means for storing the decoded inputs, and means for outputting signals in accordance with the decoded inputs.

10. A method for electrically making and breaking a plurality of connections between a first and a second circuit comprising:
  electrically switching a plurality of programmable connections between the first and a second circuit,
  determining logical combinations of different configurations of the plurality of programmable connections and programming logic inputs that select the number of groupings of programmable connections and programming a second set of inputs that determine the make or break state of each programmable connection,
  making and breaking the plurality of programmable connections in any configuration from no connections making to one or more connections making in accordance with the logical combinations, and
  selecting level shifting circuitry that, when enabled, provides a reference voltage to control terminals on the plurality of programmable connections that is lower than that of the first circuit, and when not enabled there is no level shifting.

11. The method as defined in claim 10 further comprising the steps of:
  protecting the programmable connections from undervoltages that may cause malfunctions of the programmable connections.

12. The bus switch of claim 1 wherein the selectable level shifting circuitry comprises, for each transfer transistor switches, a PMOS with its gate coupled to the enable output that makes the transfer transistor switch when true and breaks the transfer transistor switch when false, and
  a level shifting circuit with an output connected to the source of the PMOS, and an input connected to the level select input, wherein when the level select input is true there is a voltage level translation signal being transferred between the first and the second circuits and when false there is no translation between the first and second circuits.

13. The bus switch of claim 12 wherein the level shifting circuit comprises a diode connected bipolar transistor with its emitter connected to the source of the PMOS and its base and collector connected to a positive voltage source,
  a second PMOS with its source connected to the positive voltage source, its drain coupled to the emitter of the diode connected bipolar transistor, and
  the gate of the PMOS coupled to the level select input, wherein when the level select input is true the second PMOS is off and the bipolar transistor provides a voltage drop to the source of the PMOS and provides a voltage translation between the first circuit and the second circuit, and when the level select input is false, the second PMOS is on and the positive voltage potential is presented to the source of the PMOS and there is no voltage translation between the first and the second circuits.

* * * * *